(12) United States Patent
Monma et al.

(10) Patent No.: US 7,824,950 B2
(45) Date of Patent: Nov. 2, 2010

(54) SEMICONDUCTOR DEVICE AND METHOD OF FABRICATING THE SAME

(75) Inventors: Yohei Monma, Tochigi (JP); Daiki Yamada, Gunma (JP); Hidekazu Takahashi, Tochigi (JP); Yuusuke Sugawara, Tochigi (JP); Kazuo Nishi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 295 days.

(21) Appl. No.: 12/078,196

(22) Filed: Mar. 27, 2008

(65) Prior Publication Data

US 2008/0265351 A1  Oct. 30, 2008

(30) Foreign Application Priority Data

Apr. 27, 2007  (JP) .............................. 2007-118413

(51) Int. Cl.
   *H01L 21/00*  (2006.01)
(52) U.S. Cl. .............................. 438/70; 438/48; 438/65; 257/E21.514; 257/E21.584; 257/E31.117
(58) Field of Classification Search .................. 438/48, 438/65, 70; 257/E21.514, E21.584, E31.117
   See application file for complete search history.

(56) References Cited

U.S. PATENT DOCUMENTS

| | | | |
|---|---|---|---|
| 4,085,411 A | 4/1978 | Genesi | |
| 4,454,416 A | 6/1984 | Gontowski, Jr. et al. | |
| 4,485,301 A | 11/1984 | Gontowski, Jr. et al. | |
| 5,481,118 A | 1/1996 | Tew | |
| 5,501,989 A | 3/1996 | Takayama et al. | |
| 5,648,662 A | 7/1997 | Zhang et al. | |
| 5,757,456 A | 5/1998 | Yamazaki et al. | |
| 5,821,138 A | 10/1998 | Yamazaki et al. | |
| 5,834,327 A | 11/1998 | Yamazaki et al. | |
| 5,841,180 A | 11/1998 | Kobayashi et al. | |
| 5,936,231 A | 8/1999 | Michiyama et al. | |
| 5,955,726 A | 9/1999 | Takashima et al. | |
| 6,002,157 A | 12/1999 | Kozuka | |

(Continued)

FOREIGN PATENT DOCUMENTS

JP  07-086607  3/1995

(Continued)

OTHER PUBLICATIONS

"Amorphous Silicone Semiconductor Optical Sensors for Brightness Adjustment, Control of the Lighting Systems, etc., BCS Series,", TDK Homepage, Jun. 1, 2002.

(Continued)

*Primary Examiner*—Long K Tran
(74) *Attorney, Agent, or Firm*—Eric J. Robinson; Robinson Intellectual Property Law Office, P.C.

(57) ABSTRACT

In fabrication of a semiconductor device mounted on a wiring board, a semiconductor circuit portion is formed over a glass substrate. Then, an interposer having connection terminals are bonded to the semiconductor circuit portion. After that, the glass substrate is peeled off from the semiconductor circuit portion, and a mold resin is poured to cover the periphery of the semiconductor circuit portion from a direction of the separation plane. Then, the mold resin is heated under predetermined conditions to be hardened.

16 Claims, 5 Drawing Sheets

U.S. PATENT DOCUMENTS

| | | | |
|---|---|---|---|
| 6,087,648 | A | 7/2000 | Zhang et al. |
| 6,194,740 | B1 | 2/2001 | Zhang et al. |
| 6,198,133 | B1 | 3/2001 | Yamazaki et al. |
| 6,204,519 | B1 | 3/2001 | Yamazaki et al. |
| 6,236,063 | B1 | 5/2001 | Yamazaki et al. |
| 6,243,155 | B1 | 6/2001 | Zhang et al. |
| 6,287,888 | B1 | 9/2001 | Sakakura et al. |
| 6,350,981 | B1 | 2/2002 | Uno |
| 6,424,326 | B2 | 7/2002 | Yamazaki et al. |
| 6,496,240 | B1 | 12/2002 | Zhang et al. |
| 6,692,984 | B2 | 2/2004 | Yonezawa et al. |
| 6,724,012 | B2 | 4/2004 | Kimura |
| 6,734,907 | B1 | 5/2004 | Hagihara et al. |
| 6,747,638 | B2 | 6/2004 | Yamazaki et al. |
| 6,809,718 | B2 | 10/2004 | Wei et al. |
| 6,814,832 | B2 | 11/2004 | Utsunomiya |
| 6,822,211 | B2 | 11/2004 | Hagihara |
| 6,858,898 | B1 | 2/2005 | Hayakawa et al. |
| 6,867,752 | B1 | 3/2005 | Yamazaki et al. |
| 6,891,391 | B2 | 5/2005 | Hiroki |
| 6,930,326 | B2 | 8/2005 | Kato et al. |
| 6,953,599 | B2 | 10/2005 | Shiotsuka et al. |
| 6,982,406 | B2 | 1/2006 | Chen |
| 7,030,551 | B2 | 4/2006 | Yamazaki et al. |
| 7,046,282 | B1 | 5/2006 | Zhang et al. |
| 7,056,810 | B2 | 6/2006 | Yamazaki et al. |
| 7,067,392 | B2 | 6/2006 | Yamazaki et al. |
| 7,145,175 | B2 | 12/2006 | Kato et al. |
| 7,169,636 | B2 | 1/2007 | Maruyama et al. |
| 7,180,197 | B2 | 2/2007 | Nishi et al. |
| 7,253,391 | B2 | 8/2007 | Koyama et al. |
| 7,279,673 | B2 | 10/2007 | Kimura |
| 2001/0030704 | A1 | 10/2001 | Kimura |
| 2002/0011978 | A1 | 1/2002 | Yamazaki et al. |
| 2002/0012057 | A1 | 1/2002 | Kimura |
| 2002/0044208 | A1 | 4/2002 | Yamazaki et al. |
| 2003/0032210 | A1 | 2/2003 | Takayama et al. |
| 2003/0166336 | A1 | 9/2003 | Kato et al. |
| 2003/0217805 | A1* | 11/2003 | Takayama et al. ............ 156/249 |
| 2005/0056842 | A1 | 3/2005 | Nishi et al. |
| 2005/0070038 | A1* | 3/2005 | Yamazaki et al. ............. 438/30 |
| 2005/0250310 | A1* | 11/2005 | Ogawa ........................ 438/622 |
| 2006/0220211 | A1 | 10/2006 | Yamazaki et al. |
| 2006/0270114 | A1 | 11/2006 | Nishi et al. |

FOREIGN PATENT DOCUMENTS

| | | |
|---|---|---|
| JP | 08-064795 | 3/1996 |
| JP | 11-243209 | 9/1999 |
| JP | 2002-305297 | 10/2002 |
| JP | 2003-047017 | 2/2003 |
| JP | 2003-060744 | 2/2003 |
| JP | 2005-175436 | 6/2005 |

OTHER PUBLICATIONS

"Developing a Thin and High Output Visible Light Sensor Using a Plastic Substrate,", TDK Homepage (Press Release), Oct. 1, 2003.

"A Visible Light Sensor and an Amplifier Circuit Succeeded in Forming Them Within the Size of 2×1.5 MM on a Plastic Chip,", Denpa Shinbun, Oct. 2, 2003.

"Bring About High Output and Downsizing,", The Nikkan Kogyo Shinbun, Oct. 2, 2003.

"Thin and High Output Visible Light Sensor,", Kagaku Kougyou Shinbun, Oct. 2, 2003.

* cited by examiner

SEMICONDUCTOR DEVICE AND METHOD OF FABRICATING THE SAME

BACKGROUND OF THE INVENTION

1. Field of the Invention

The present invention relates to a thin and lightweight semiconductor device and a method of fabricating the same.

2. Description of the Related Art

In recent years, flat panel displays such as liquid crystal displays or organic EL displays have been used as a display device of a portable information device such as a mobile phone or PDA or a mobile personal computer.

Such a display device detects the surrounding luminance with an optical sensor, and controls the luminance to be displayed on the display device. By detecting the surrounding luminance in this way to obtain appropriate luminance to be displayed on the display device, wasteful power consumption can be reduced.

An optical sensor is made mainly of a semiconductor, and a typical example of the semiconductor material is silicon. Optical sensors formed using silicon are divided into sensors made of single-crystalline silicon or polysilicon and sensors made of amorphous silicon. An optical sensor made of single-crystalline silicon or polysilicon has the highest sensitivity to light in the infrared region of around 800 nm, and is sensitive to light with a wavelength of up to around 1100 nm. On the other hand, an optical sensor made of amorphous silicon has little sensitivity to light in the infrared region and has the highest sensitivity to light with a wavelength of around 500 to 600 nm which are the central wavelengths of the visible region. That is, an optical sensor made of amorphous silicon has sensing properties close to the human visual sensitivity.

Such an optical sensor is generally in the form of a chip formed by integrating a sensor element and an output amplifier circuit constructed from thin film transistors over an insulating substrate, and is mounted on a wiring board.

With a reduction in size of portable information devices, there has also been a demand for a reduction in thickness and weight of a device like an optical sensor mounted on a wiring board. In order to meet such demand, a sensor element formed using a thin insulating substrate has been developed, for example (e.g., see Reference 1: Japanese Published Patent Application No. 2005-175436).

SUMMARY OF THE INVENTION

However, when a glass substrate is used, there is a limit to reducing the thickness of the optical sensor. For example, when a glass substrate with a thickness of less than or equal to 0.2 mm is used, there is a problem in that the substrate could break if it is mounted on a wiring board by thermal compression. In addition, using a glass substrate has another problem in that it involves an additional step of polishing and increases the cost because yields could drop due to chipping, cracking, or the like of the glass substrate.

In view of the foregoing problems, it is an object of the present invention to reduce the cost, thickness, and weight of a semiconductor device like an optical sensor mounted on a wiring board, without a glass substrate mounted.

Also, in view of the foregoing problems, it is another object of the present invention to reduce the thickness and weight of a semiconductor device like an optical sensor mounted on a wiring board and to increase the strength of the semiconductor device, by covering its semiconductor circuit portion with a resin.

In order to achieve the above objects, a semiconductor device of the present invention is, for example, a semiconductor device mounted on a wiring board, which is not formed on glass but is covered with a resin. In addition, a method of fabricating a semiconductor device of the present invention is a method including the steps of, for example, forming a semiconductor circuit or the like over a glass substrate, separating the semiconductor circuit or the like from the glass substrate, and covering a surface of the semiconductor circuit or the like, which has been separated from the glass substrate, with a resin layer.

According to the semiconductor device and the method of fabricating the semiconductor device of the present invention, a semiconductor device mounted on a wiring board is not formed on glass but is covered with a resin layer. Therefore, the semiconductor device can be thinner than the case where it is formed on glass, and thus a reduction in thickness and weight of the device can be achieved. In particular, when end portions of the device are also covered with the resin, the strength of the device can be advantageously increased.

DETAILED DESCRIPTION OF THE INVENTION

Embodiment Mode

An embodiment mode of the present invention will be described in detail with reference to the accompanying drawings. Note that it will be easily understood by those skilled in the art that the present invention can be embodied in various different ways and, therefore, various modifications and variations can be made to the present invention without departing from the spirit and scope thereof. Thus, the present invention should not be construed as being limited to the description in the following embodiment mode. Note that in the structure of the present invention described below, portions that are the same will be denoted by the same reference numerals in all drawings.

Figure 1A:
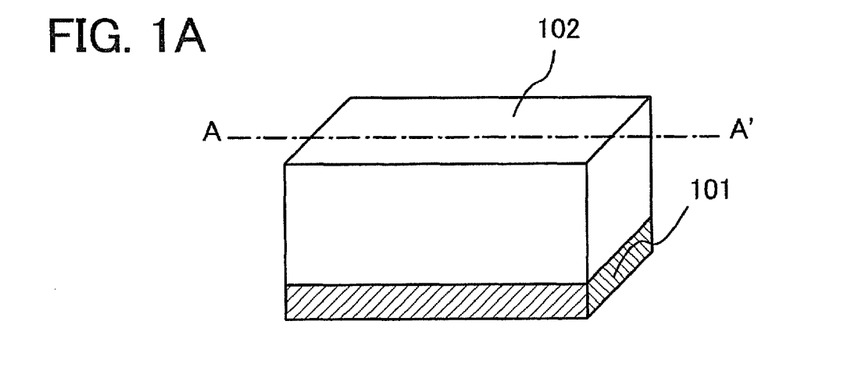
FIGS. 1A to 1D illustrate semiconductor devices in accordance with an embodiment mode of the present invention.
Figure 1B:
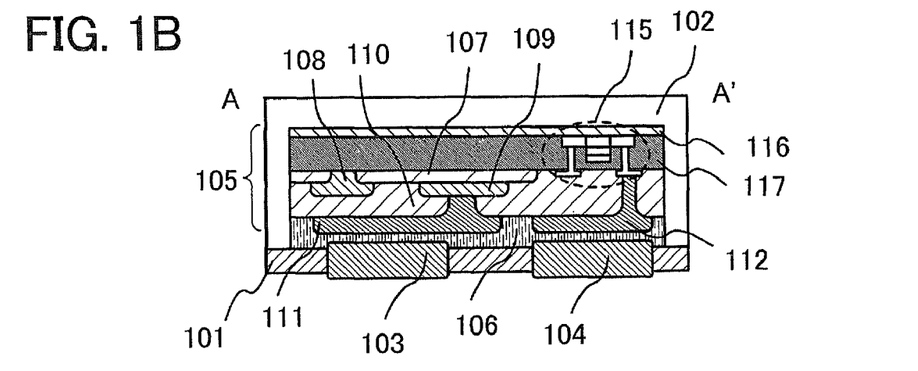
Figure 1C:
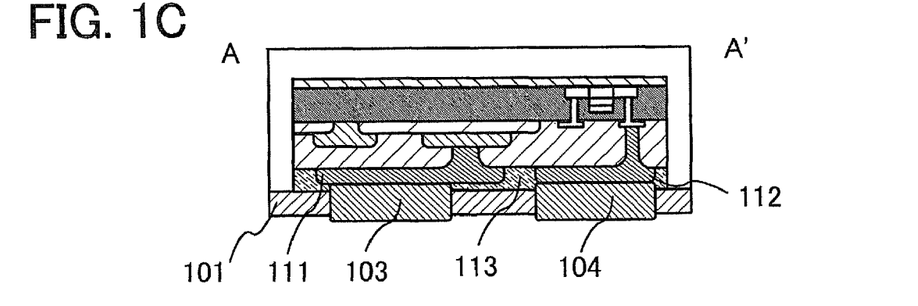
Figure 1D:
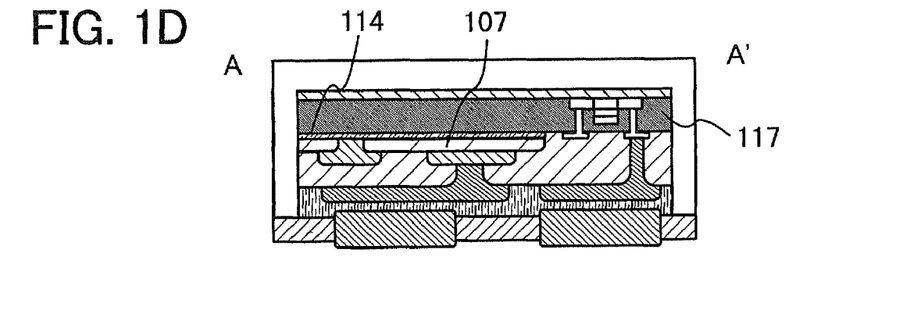

Hereinafter, a semiconductor device and a method of fabricating the semiconductor device in accordance with this embodiment mode will be described with reference to the drawings. FIGS. 1A to 1D illustrate semiconductor devices of this embodiment mode. FIG. 1A is a perspective view of a semiconductor device. FIG. 1B is a cross-sectional view along line A-A' of FIG. 1A. FIGS. 1C and 1D are cross-sectional views along line A-A' of FIG. 1A, which have different structures from FIG. 1B.

As illustrated in FIG. 1A, the semiconductor device in the this embodiment mode includes an interposer 101, a semiconductor circuit portion (not shown) formed over the interposer 101, and a mold resin 102 covering the semiconductor circuit portion.

FIG. 1B is a cross-sectional view along line A-A' of FIG. 1A. In FIG. 1B, connection terminals 103 and 104 are provided for the interposer 101. The interposer 101 and a semiconductor circuit portion 105 are bonded to each other with an anisotropic conductive adhesive 106 which includes an anisotropic conductive material.

The semiconductor circuit portion 105 constitutes an optical sensor and an amplifier circuit. The optical sensor is constructed from a semiconductor film 107 formed by sequentially stacking p-type, i-type, and n-type silicon layers; a first electrode 108 electrically connected to the p-type layer of the semiconductor film 107; and a second electrode 109 electrically connected to the n-type layer of the semiconductor film 107. The amplifier circuit is constructed from typical electronic elements. Here, only a thin film transistor (TFT) 115 is shown for simplicity.

The thin film transistor 115 is formed on the base film 116 (below the base film 116 in the drawing, and the same shall apply hereinafter), and an optical sensor is formed over an interlayer insulating film 117 over the thin film transistor 115. An extraction electrode of the thin film transistor 115 is formed over the interlayer insulating film and in a contact hole of the interlayer insulating film.

An insulating film 110 is formed on the first electrode 108, the second electrode 109, the semiconductor film 107, the interlayer insulating film 117, and the extraction electrode of the thin film transistor 115, excluding a part of the lower portions of the extraction electrode of the thin film transistor 115 and the second electrode 109. In addition, a first electrode terminal 111 electrically connected to the second electrode 109 and a second electrode terminal 112 electrically connected to the extraction electrode of the thin film transistor 115 are formed.

The first electrode terminal 111 and the second electrode terminal 112 are fixed in positions corresponding to the connection terminals 103 and 104, respectively, of the interposer 101. The first electrode terminal 111 is electrically connected to the connection terminal 103 with the anisotropic conductive adhesive 106, and the second electrode terminal 112 is electrically connected to the connection terminal 104 with the anisotropic conductive adhesive 106.

The semiconductor circuit portion 105 and the anisotropic conducive adhesive 106 are covered with a resin. In this embodiment mode, the mold resin 102 is used as the resin. In this embodiment mode, the semiconductor circuit portion 105 constitutes the optical sensor. Therefore, the mold resin 102 preferably has a light-transmitting property.

Upon receiving light with the semiconductor circuit portion 105 from above in FIG. 1B, a potential difference is generated between the first electrode 108 and the second electrode 109. Then, the potential difference is amplified by the amplifier circuit and is output through the connection terminals 103 and 104 of the interposer 101, so that the semiconductor circuit portion 105 functions as an optical sensor.

Although the optical sensor and the amplifier circuit are illustrated as exemplary components of the semiconductor circuit portion 105 in this embodiment mode, the present invention is not limited to these, and an integrated circuit with a different function may be employed.

The interposer 101 in this specification refers to a connector in an IC package or the like, which connects a semiconductor chip to a mother board, or a relay substrate that forms connection wiring between chips or chip layers. The interposer 101 can be a lead frame made of metal such as copper, a TAB tape, a resin substrate, or the like. Typical examples of a substrate used for the interposer 101 include a glass epoxy resin substrate, a polyimide substrate, a ceramic substrate, a glass substrate, an alumina substrate, an aluminum nitride substrate, and a metal substrate.

Examples of the mold resin 102 include epoxy resins, acrylic resins, silicone resins, urethane resins, polyimide resins, and polyethylene resins.

Typical examples of the anisotropic conductive adhesive 106 include an adhesive resin in which conductive particles (with a grain diameter of about 3 to 7 μm) are dispersed or included, such as an epoxy resin or a phenol resin. The conductive particles (with a grain diameter of about 3 to 7 μm) are formed from one or more elements of gold, silver, copper, palladium, and platinum. Alternatively, the conductive particles can be particles with a multi-layer structure of such elements.

Further, the conductive particles can also be particles formed of a resin and having a surface covered with a thin film formed from one or more elements of gold, silver, copper, palladium, and platinum.

Instead of the anisotropic conductive adhesive, it is also possible to use an anisotropic conductive film transferred to a base film. Conductive particles similar to those of the anisotropic conductive adhesive are dispersed in the anisotropic conductive film.

In the structure described above, the semiconductor circuit portion 105 is not formed on glass but is covered with the mold resin 102, including its side portions. Therefore, the semiconductor device can be formed to be thinner than the case where the semiconductor circuit portion 105 is formed on glass. Specifically, when the semiconductor circuit portion 105 is formed on glass with a thickness of less than 0.2 mm, the glass could break with high probability when a pressure of about 20 N is applied upon mounting the semiconductor circuit portion 105 on a wiring board. However, the present inventors have confirmed that, when the semiconductor circuit portion 105 is covered with a mold resin having a thickness of about 0.15 mm at most, the semiconductor device can have sufficient strength against a pressure of about 20 N.

When mounting the semiconductor device with the above structure on a wiring board, it is acceptable as long as exposed portions of the connection terminals 103 and 104 of the interposer 101 are electrically connected to predetermined electrodes of a wiring board with a solder paste, and thus are mechanically fixed.

FIG. 1C is a cross-sectional view along line A-A' of FIG. 1A, which has a different structure from FIG. 1B. Although FIG. 1B illustrates the case where the anisotropic conductive adhesive 106 is used for bonding the interposer 101 and the semiconductor circuit portion 105 to each other, FIG. 1C illustrates a case where a typical adhesive 113 (which may be non-conductive) is used as an adhesive and the first electrode terminal 111 and the second electrode terminal 112 are in direct contact with the connection terminals 103 and 104, respectively, so that they are electrically connected. FIG. 1C differs from FIG. 1B only in this point.

FIG. 1D is a cross-sectional view along line A-A' of FIG. 1A, which illustrates a case where a color filter is added to the structure of FIG. 1B. A color filter 114 can be provided to be in contact with the p-type layer of the semiconductor film 107, and can transmit light with only a particular wavelength (for example, red, blue, or green light) among light incident from above in FIG. 1D to enter the semiconductor film 107. The semiconductor circuit portion 105 with such a structure functions as a color sensor. The color filter 114 is formed by mixing a predetermined pigment into an acrylic resin, an epoxy resin, an urethane resin, or the like in accordance with the wavelength of light to be transmitted.

Note that the pigment contains a substance which could cause metallic contamination such as copper, sodium, or potassium. Therefore, an over-coat layer may be provided between the semiconductor film 107 and the color filter 114 in order to prevent the metallic contamination of the semiconductor film 107. The over-coat layer may be formed with a light-transmissive insulating material. For example, organic resin materials such as an acrylic resin or a polyimide resin or inorganic materials such as silicon nitride, silicon oxide, silicon oxide containing nitrogen, or silicon nitride containing oxygen can be used.

Although FIG. 1D illustrates the example in which the color filter 114 is added to the structure of FIG. 1B, it is apparent that the color filter 114 can also be added to the structure of FIG. 1C in a similar way.

The color filter can also be realized by using a resin which is mixed with a pigment for the mold resin 102 in the structure of FIG. 1B or 1C.

Hereinafter, a method of fabricating a semiconductor device with the structure of FIG. 1B will be described. FIGS. 2A to 5D illustrate the fabrication steps. FIGS. 2A, 2C, 3A, 3C, 4A, 4C, 5A, and 5C are top views of substrates. FIGS. 2B, 3B, 4B, and 5B are cross-sectional views along lines B-B' of FIGS. 2A, 3A, 4A, and 5A, respectively. FIGS. 2D, 3D, 4D, and 5D are cross-sectional views along lines C-C' of FIGS. 2C, 3C, 4C, and 5C, respectively.

Figure 2A:
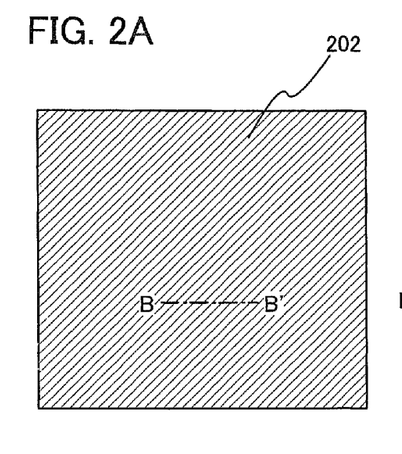
FIGS. 2A to 2D illustrate the steps of fabricating the semiconductor device in the embodiment mode.
Figure 2B:
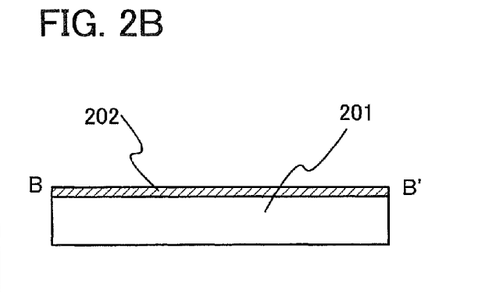

First, as illustrated in FIGS. 2A and 2B, a peeling layer 202 is formed over a glass substrate 201. The peeling layer 202 is formed by depositing a layer made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), or an alloy material or a compound material containing such an element, by sputtering, plasma CVD, or the like. The peeling layer 202 may be either a single layer or stacked layers of the above-described materials. The structure of a layer containing silicon may be any of amorphous, microcrystalline, and polycrystalline structures.

When the peeling layer 202 is formed with a single-layer structure, a tungsten layer, a molybdenum layer, or a layer containing a mixture of tungsten and molybdenum is formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum is, for example, an alloy of tungsten and molybdenum. In addition, the oxide of tungsten is referred to as tungsten oxide in some cases.

When the peeling layer 202 is formed with a stacked structure, a tungsten layer, a molybdenum layer, or a layer containing a mixture of tungsten and molybdenum is formed as a first layer, and a layer containing oxide, nitride, oxynitride, or nitride oxide of tungsten, molybdenum, or a mixture of tungsten and molybdenum is formed as a second layer.

When the peeling layer 202 is formed with a stacked structure of a tungsten layer and a tungsten oxide layer, a tungsten layer may be formed first and a silicon oxide layer may be formed on the tungsten layer so that a tungsten oxide layer formed at an interface between the tungsten layer and the silicon oxide layer can be utilized. The same can be said for the case of forming a layer containing nitride, oxynitride, or nitride oxide of tungsten. In that case, after formation of a tungsten layer, a silicon nitride layer, a silicon oxynitride layer, or a silicon nitride oxide layer may be formed on the tungsten layer.

Tungsten oxide is represented by $WO_x$ where x is in the range of 2 to 3. The value of x can be 2 ($WO_2$), 2.5 ($W_2O_5$), 2.75 ($W_4O_{11}$), 3 ($WO_3$), or the like. In forming tungsten oxide, the value of x described above is not particularly limited, and which oxide is to be formed may be determined based on the etching rate or the like. A tungsten oxide ($WO_x$ where $0<x<3$) layer formed by sputtering under an oxygen atmosphere has the highest etching rate. Therefore, in order to reduce the fabrication time, it is preferable to use a tungsten oxide layer formed by sputtering under an oxygen atmosphere for the peeling layer. In addition, in the case of forming a peeling layer with a stacked structure of a metal layer and a metal oxide layer, the metal layer may be formed first and plasma treatment may be applied to the metal layer so that a metal oxide film is formed on the metal layer. When the plasma treatment is applied under an oxygen atmosphere, a nitrogen atmosphere, an $N_2O$ atmosphere, or the like, it is possible to form a metal oxide film, a metal oxynitride film, or the like on the metal layer.

Figures 2C, 2D:
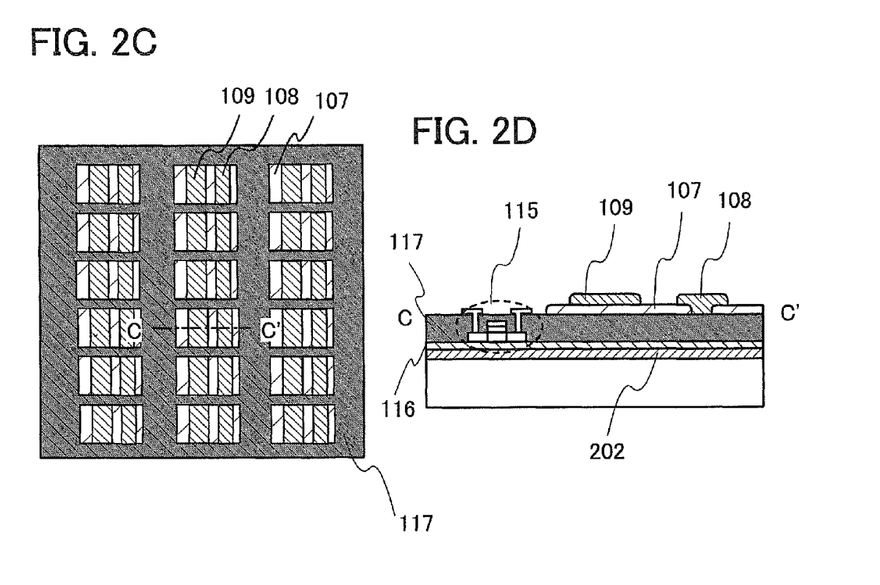

Next, as illustrated in FIGS. 2C and 2D, the base film 116, the thin film transistor 115, and the interlayer insulating film 117 are formed over the peeling layer 202 by an ordinary method. An extraction electrode of the thin film transistor 115 is formed over the interlayer insulating film 117 and in a contact hole of the interlayer insulating film 117.

The base film 116 is provided in order to prevent alkali metal such as Na or alkaline earth metal included in the glass substrate 201 from diffusing into a semiconductor film, which would otherwise adversely affect the characteristics of a semiconductor element such as a TFT. In addition, the base film 116 also serves to protect the semiconductor element in a later step of separating the semiconductor element. The base film 116 may be either a single layer or stacked layers of a plurality of insulating films. Therefore, the base film 116 is formed using an insulating film made of silicon oxide, silicon nitride, or silicon nitride oxide which can suppress diffusion of alkali metal or alkaline earth metal into the semiconductor film.

In this embodiment mode, the base film 116 is formed by sequentially depositing a silicon oxynitride film with a thickness of 100 nm, a silicon oxynitride film with a thickness of 50 nm, and a silicon oxynitride film with a thickness of 100 nm. However, the materials, thickness, and number of stacked layers of the base film 116 are not limited to these. For example, instead of the silicon oxynitride film of the bottom layer, a siloxane resin may be deposited to a thickness of from 0.5 to 3 μm by spin coating, slit coating, a droplet discharge method, printing, or the like. In addition, the silicon oxynitride film of the middle layer may be replaced with a silicon nitride film. Further, the silicon oxynitride film of the top layer may be replaced with a silicon oxide film. In addition, the thickness of each layer is preferably from 0.05 to 3 μm, and the thickness can be freely selected from this range.

Alternatively, the base film 116 can be formed by sequentially stacking a silicon oxynitride film or a silicon oxide film, a siloxane resin film, and a silicon oxide film.

Note that silicon oxynitride in this specification refers to a substance which contains more oxygen than nitrogen. The silicon oxynitride herein can also be referred to as silicon oxide containing nitrogen. In addition, silicon nitride oxide in this specification refers to a substance which contains more nitrogen than oxygen. The silicon nitride oxide herein can also be referred to as silicon nitride containing oxygen.

The interlayer insulating film 117 can be formed using a heat-resistant organic resin such as polyimide, acrylic, or polyamide. In addition to such organic resins, a low-dielectric constant material (a low-k material), a resin having a Si—O—

Si bond (hereinafter also referred to as a siloxane resin), or the like can be used. Siloxane has a skeletal structure with the bond of silicon (Si) and oxygen (O). As a substituent of siloxane, an organic group including at least hydrogen (for example, an alkyl group or an aryl group) is given. Alternatively, a fluoro group may be given as the substituent, or both a fluoro group and an organic group including at least hydrogen may be given as the substituent. The method of forming the interlayer insulating film 117 can be selected in accordance with a material used. For example, spin coating, dipping, spray coating, a droplet discharge method (such as ink-jet printing, screen printing, or offset printing), a doctor knife, a roll coater, a curtain coater, a knife coater, or the like can be used. Besides, inorganic materials such as silicon oxide, silicon nitride, silicon oxynitride, PSG (phosphosilicate glass), PBSG (phosphorus boron silicate glass), BPSG (borophosphosilicate glass), an alumina film can also be used. The interlayer insulating film 117 can also be formed by stacking such insulating films.

Further, the interlayer insulating film 117 may have two layers. In that case, a film containing carbon such as DLC (diamond-like carbon) or carbon nitride (CN), a silicon oxide film, a silicon nitride film, a silicon nitride oxide film, or the like can be used as a second interlayer insulating film. The second interlayer insulating film of the interlayer insulating film 117 can be formed by plasma CVD, atmospheric-pressure plasma CVD, or the like. It is also possible to use photosensitive or non-photosensitive organic materials such as polyimide, acrylic, polyamide, resist, or benzocyclobutene; a siloxane resin; or the like.

Next, the semiconductor film 107 is formed with a plasma CVD apparatus over a region of the interlayer insulating film 117 in which the thin film transistor 115 is not formed. Here, the semiconductor film 107 is formed by sequentially depositing p-type, i-type, and n-type silicon layers. The phase of the i-type layer which is a light-receiving portion is amorphous, whereas the phases of the p-type and n-type layers are not particularly limited. The i-type layer is formed to a thickness of from 100 to 1000 nm in accordance with the illuminance range of an element to be formed. In this embodiment mode, a silicon semiconductor film with a thickness of 800 nm is deposited.

Next, in order to form a junction between the p-type silicon film which is the bottom layer of the semiconductor film 107 and the first electrode 108 to be deposited in the next step, a contact hole with a dot shape is formed in a predetermined position through a laser scribing step. In this embodiment mode, YAG laser with a wavelength of 1.06 μm and a beam diameter Ø of 60 μm is used, and the semiconductor film 107 is scanned with a laser beam with a repetition rate of 1 kHz such that beams do not overlap with each other.

Next, the first electrode 108 and the second electrode 109 are formed. The first electrode 108 and the second electrode 109 are each formed by depositing a metal conductive film in a single layer or stacked layers. As a deposition method, sputtering, evaporation, plating, or a combination of them is used. When a gas-phase method such as sputtering or evaporation is used, electrodes with desired shapes can be easily obtained by using a metal mask. A metal mask has two opening portions for one element. With the metal mask, electrodes with opposite polarities are formed at the same time. The metal mask, the glass substrate 201, and a plate-like magnet are disposed in a sequentially overlapped manner with each other in a sputtering apparatus, and the metal mask and the glass substrate 201 are tightly stuck together to avoid film deposition at an unintended area, which could otherwise result in nonuniform electrode areas. When plating is employed, a region in which the first electrode 108 and the second electrode 109 are not to be formed may be masked with a resin by screen printing, so that electrodes with desired shapes can be obtained by a lift-off method after the deposition of the first electrode 108 and the second electrode 109. Accordingly, the first electrode 108 and the second electrode 109 each having a thickness of from 0.5 to 100 μm are formed.

In this embodiment mode, the first electrode 108 and the second electrode 109 are formed by sputtering of Ni metal using a metal mask. The metal mask is made of Ni with a thickness of 0.1 mm, and is placed in a sputtering apparatus such that the metal mask and the glass substrate 201 are tightly stuck together with a plate-form magnet. For sputtering, a 6-inch Ø Ni target with a purity of 99.99% is used, and a film made of nickel with a thickness of 1.5 μm is deposited with an RF output power of 1.0 kW under an Ar atmosphere of 1.0 Pa.

Figure 3A:
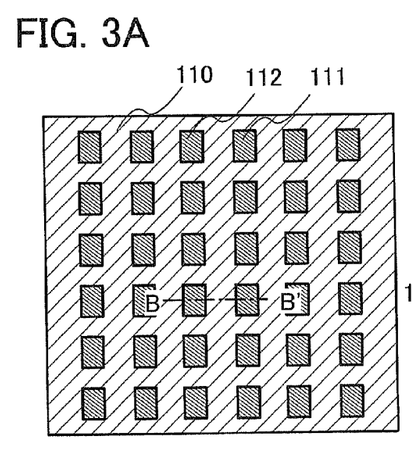
FIGS. 3A to 3D illustrate the steps of fabricating the semiconductor device in the embodiment mode.
Figure 3B:
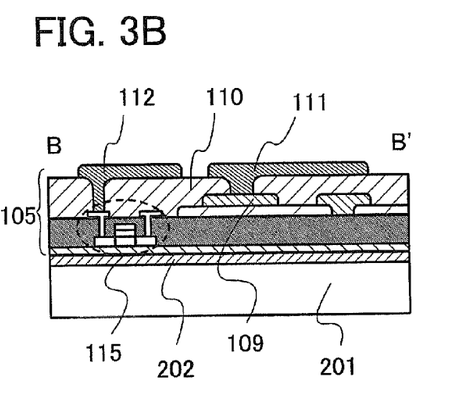

Next, as illustrated in FIGS. 3A and 3B, an insulating film 110 having opening portions, which partially expose the extraction electrode of the thin film transistor 115 and the second electrode 109, is formed. The insulating film 110 is formed by screen printing. Alternatively, the insulating film 110 may be formed by the steps of depositing an insulating film over the entire surface of the substrate by CVD or coating and partially etching the insulating film to form a contact hole which exposes each electrode. By opening the contact holes in a symmetrical fashion, the optical sensor can be prevented from tilting when it is mounted on a wiring board.

Next, the first electrode terminal 111 and the second electrode terminal 112 which are the extraction electrodes are formed in the contact holes which partially expose the extraction electrode of the thin film transistor 115 and the second electrode 109. The electrode terminals can be each formed by depositing a conductive film containing a metal element such as silver, gold, copper, platinum, or nickel. In this embodiment mode, an extraction electrode with a size of 1.35 mm×1.8 mm is formed. In this embodiment mode, the electrode terminals are formed by screen printing using a resin paste containing copper. Through the above steps, the semiconductor circuit portion 105 is formed over the peeling layer 202 over the glass substrate 201.

Figure 3C:
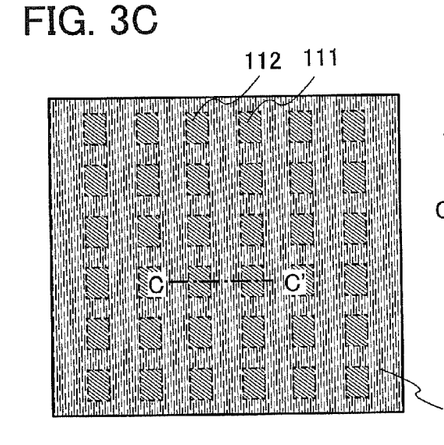
Figure 3D:
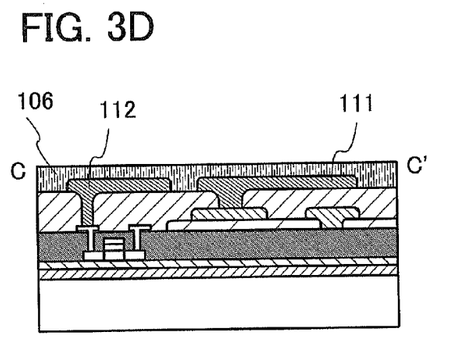

Next, as illustrated in FIGS. 3C and 3D, the anisotropic conductive adhesive 106 is applied to the substrate. In this embodiment mode, an epoxy resin in which silver particles are dispersed is applied. Although the anisotropic conductive adhesive 106 is applied to the substrate by coating in this embodiment mode, the anisotropic conductive adhesive 106 may be applied by printing, specifically, screen printing. When screen printing is employed, the anisotropic conductive adhesive can be disposed in a position excluding a dicing line which is used for dicing the optical sensor later. Therefore, the adhesive does not interrupt dicing of the substrate. Note that in FIG. 3C, a portion indicated by a dashed line is drawn in order to show the positions of the first electrode terminal 111 and the second electrode terminal 112, though it cannot be seen from above when the anisotropic conductive adhesive 106 is not transparent.

Figure 4A:
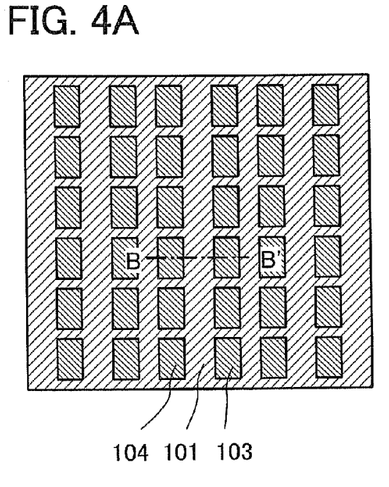
FIGS. 4A to 4D illustrate the steps of fabricating the semiconductor device in the embodiment mode.
Figure 4B:
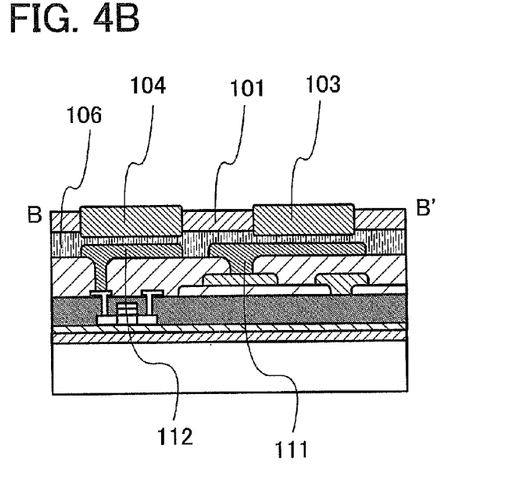

Next, as illustrated in FIGS. 4A and 4B, the interposer 101 having the connection terminals 103 and 104 which penetrate the interposer is disposed above the anisotropic conductive adhesive 106. At this time, the interposer 101 is disposed such that the first electrode terminal 111 and the second electrode terminal 112 are provided in corresponding positions to the connection terminals 103 and 104, respectively, of the interposer 101. The interposer 101 is attached to the semiconductor circuit portion 105 by thermocompression bonding.

Figure 4C:
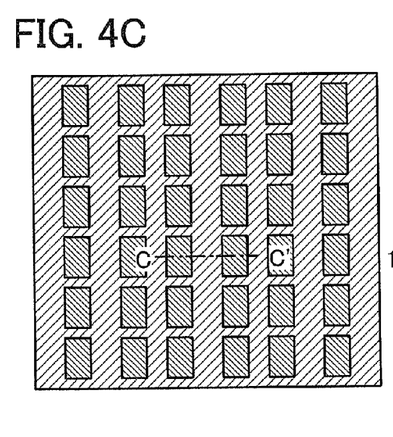
Figure 4D:
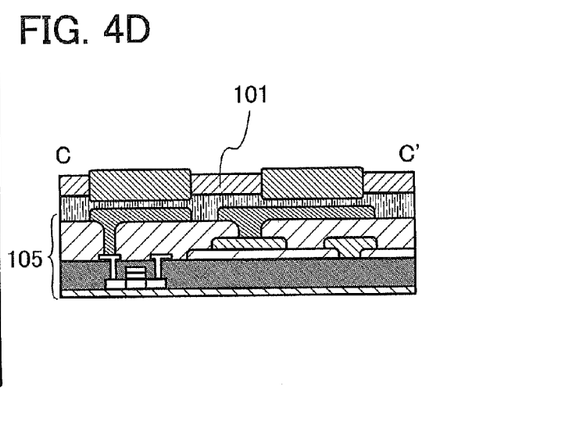

Next, as illustrated in FIGS. 4C and 4D, the glass substrate 201 is peeled off from the semiconductor circuit portion 105 with the peeling layer 202 as a separation plane. Peeling is accomplished by the steps of forming a cut section in an end portion of the peeling layer 202 and soaking the device in water or injecting water into the cut section of the peeling layer 202, using a dropper or the like. Alternatively, after attaching a film to the interposer 101, the glass substrate 201 from the semiconductor circuit portion 105 can be peeled by using the film.

Figure 5A:
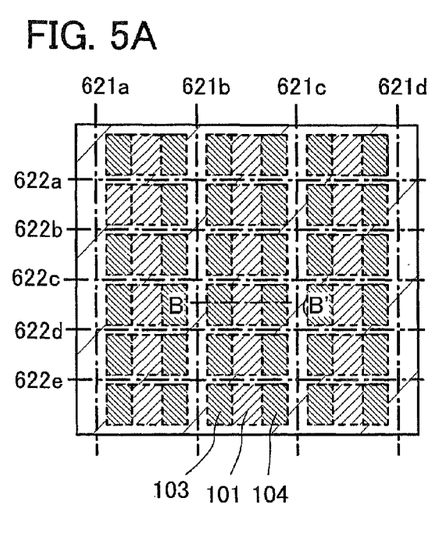
FIGS. 5A to 5D illustrate the steps of fabricating the semiconductor device in the embodiment mode.
Figure 5B:
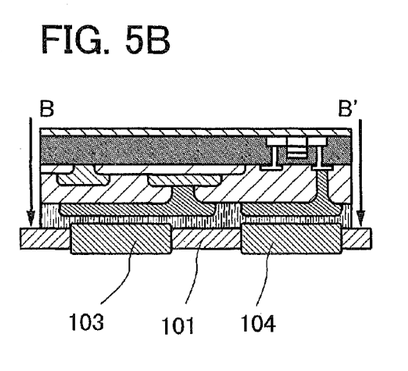

Next, as illustrated in FIGS. 5A and 5B, half-cutting is performed in the periphery of the semiconductor circuit portion 105 in a direction from the separation plane toward the bottom side to form the groove. That is, half cutting is performed to expose the interposer 101 along axes 621a to 621d parallel with the short axis of the semiconductor circuit portion 105 and axes 622a to 622e crossing at right angles with the axes 621a to 621d (that is, axes parallel with the long axis of the semiconductor circuit portion 105) in a region where the semiconductor circuit portion 105 is not formed. For half-cutting, a dicing blade or laser is employed. Note that in FIG. 5A, a portion indicated by a dashed line is drawn in order to show the positions of the interposer 101 and its connection terminals 103 and 104, though it cannot be seen from above.

Figure 5C:
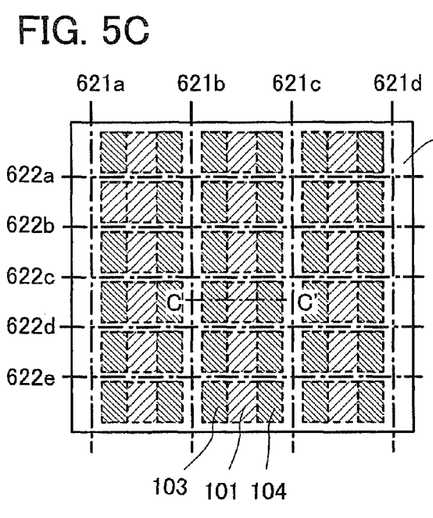
Figure 5D:
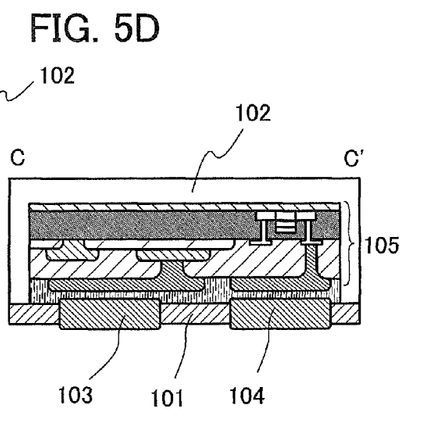

Next, as illustrated in FIGS. 5C and 5D, the mold resin 102 is applied to the separation plane of the semiconductor circuit portion 105 and the periphery of the semiconductor circuit portion 105. At this time, the mold resin 102 is filled into the groove, that is, a portion which has been half-cut in the preceding step. Then, the mold resin is heated under predetermined conditions to be hardened.

Examples of the mold resin 102 include epoxy resins, acrylic resins, silicone resins, urethane resins, polyimide resins, and polyethylene resins. In this embodiment mode, the mold resin 102 preferably has a light-transmitting property since the semiconductor circuit portion 105 constitutes the optical sensor.

Next, the optical sensor is separated by cutting the portion which has been half-cut in the preceding step, using a dicing blade or laser in a similar way. At this time, cutting is conducted with a dicing blade or a laser such that a width of cut portion in H-H' cross section is narrower than that of the half-cut portion. Accordingly, the mold resin 102 remains on the end potions of the optical sensor. Note that in FIG. 5C, a portion indicated by a dashed line is drawn in order to show the positions of the interposer 101 and its connection terminals 103 and 104, though it cannot be seen from above.

Through the above steps, an optical sensor which is a semiconductor device of this embodiment mode can be fabricated. In the fabrication steps described above, a glass substrate is not used in the final product, and the semiconductor device is covered with a resin. Therefore, there is no need to polish glass, and the semiconductor device can be free from a drop in yield due to chipping, cracks, and the like of the glass. Thus, a reduction in cost, thickness, and weight of the semiconductor device can be achieved.

With regard to a method of fabricating a semiconductor device with the structure illustrated in FIG. 1C, referring to the steps illustrated in FIGS. 3C and 3D described for the method of fabricating a semiconductor device with the structure of FIG. 1B, a typical nonconductive adhesive may be applied to a portion excluding the first electrode terminal 111 and the second electrode terminal 112, instead of using the anisotropic conductive adhesive. Then, the interposer 101 may be attached to the semiconductor circuit portion 105 such that the first electrode terminal 111 and the second electrode terminal 112 are in direct contact with the connection terminals 103 and 104, respectively, of the interposer 101.

With regard to a method of fabricating a semiconductor device with the structure illustrated in FIG. 1D, referring to the steps illustrated in FIGS. 2C and 2D described for the method of fabricating a semiconductor device with the structure of FIG. 1B, the color filter 114 may be formed before the formation of the semiconductor film 107 on the interlayer insulating film 117. The color filter 114 is formed by depositing an acrylic resin, an epoxy resin, an urethane resin, or the like, in which a predetermined pigment is mixed in accordance with the wavelength of light to be transmitted, by spin coating or the like.

In the case of forming an over-coat layer between the semiconductor film 107 and the color filter 114 using an organic resin material such as an acrylic resin or a polyimide resin, for example, the over-coat layer may be deposited by spin coating. On the other hand, when the over-coat layer is formed using an inorganic material such as silicon nitride, silicon oxide, silicon oxide containing nitrogen, or silicon nitride containing oxygen, the over-coat layer may be deposited by sputtering, vacuum evaporation, or the like.

Embodiment 1

With the semiconductor device obtained in accordance with the embodiment mode of the present invention, various electronic devices can be fabricated. Electronic devices include mobile phones, laptop personal computers, game machines, car navigation systems, portable audio devices, handy AV equipment, digital cameras, film cameras, instant cameras, indoor air conditioners, car air conditioners, ventilation and air-conditioning systems, electric pots, CRT projection TV, lighting systems, and lighting facilities. Specific examples of such electronic devices will be described hereinafter.

The optical sensor of the present invention can be used for a mobile phone, a laptop personal computer, a digital camera, a game machine, a car navigation system, a portable audio device, and the like, as a sensor for optimal adjustment of display luminance and backlight illuminance as well as a sensor for saving a battery. In addition, such an electronic device can be provided with a solar battery as a battery. Since the semiconductor device of the present invention is compact and has a high degree of integration, the size of the electronic device can also be small.

The optical sensor of the present invention can be mounted on a key switch of a mobile phone or on handy AV equipment, as a sensor for controlling on/off of a backlight LED or a cold-cathode tube as well as a sensor for saving a battery. By mounting such a sensor and turning off the switch in a bright environment, battery consumption due to long-time operation of buttons can be reduced. Since the semiconductor device of the present invention is compact and has a high degree of integration, the size of the electronic device can also be small and power saving can be achieved.

The optical sensor of the present invention can be mounted on a digital camera, a film camera, or an instant camera, as a flash control sensor or an aperture control sensor. In addition, such an electronic device can be provided with a solar battery as a battery. Since the semiconductor device of the present invention is compact and has a high degree of integration, the size of the electronic device can also be small.

The optical sensor of the present invention can be mounted on an indoor air conditioner, a car air conditioner, or a ventilation and air-conditioning system, as a sensor for controlling air volume or temperature. Since the semiconductor device of the present invention is compact and has a high degree of integration, the size of the electronic device can also be small and power saving can be achieved.

The optical sensor of the present invention can be mounted on an electric pot as a temperature-retention control sensor. By mounting such a sensor, the retained temperature can be set low in a dark environment. In addition, since the semiconductor device of the present invention is compact and thin, it can be provided at any desired position. Consequently, power saving can be achieved.

The optical sensor of the present invention can be mounted on a display of a CRT projection TV as a sensor for adjusting the positions of RGB scanning lines (digital auto convergence). Since the semiconductor device of the present invention is compact and has a high degree of integration, the size of the electronic device can also be small. In addition, the sensor can be provided at any desired position. Further, high-speed automatic control of the CRT projection TV is possible.

The optical sensor of the present invention can be provided for various domestic lighting systems, outdoor lamps, street lamps, unmanned public facilities, athletic fields, cars, calculators, and the like, as a sensor for controlling on/off of various lighting systems and lighting facilities. Using the sensor of the present invention can save electric power. In addition, by providing a solar battery, to which the present invention is applied, in such an electronic device as a battery, the thickness of the battery can be reduced and the size of the electronic device can be small.

This application is based on Japanese Patent Application serial no. 2007-118413 filed with Japan Patent Office on Apr. 27, 2007, the entire contents of which are hereby incorporated by reference.

What is claimed is:

1. A method of manufacturing a semiconductor device, comprising the steps of:
   forming a peeling layer over a substrate;
   forming a semiconductor circuit including an electrode terminal over the peeling layer;
   attaching the semiconductor circuit and an interposer provided with a connection terminal with an anisotropic conductive adhesive interposed therebetween in such a manner that the electrode terminal and the connection terminal are electrically connected to each other through the anisotropic conductive adhesive, wherein the connection terminal penetrates the interposer;
   separating the substrate from the semiconductor circuit at the peeling layer; and
   covering the semiconductor circuit with a resin layer so that the semiconductor circuit is interposed between the interposer and the resin layer and side surfaces of the semiconductor circuit are in contact with the resin layer.

2. The method of manufacturing a semiconductor device according to claim 1, wherein the semiconductor circuit includes an optical sensor for detecting light.

3. The method of manufacturing a semiconductor device according to claim 2, wherein the optical sensor includes a color filter.

4. The method of manufacturing a semiconductor device according to claim 1, further comprising the step of:
   forming the anisotropic conductive adhesive over the semiconductor circuit before the step of attaching.

5. A method of manufacturing a semiconductor device, comprising the steps of:
   forming a peeling layer over a substrate;
   forming a semiconductor circuit including an electrode terminal over the peeling layer;
   attaching the semiconductor circuit and an interposer provided with a connection terminal with an adhesive interposed therebetween in such a manner that the electrode terminal and the connection terminal are in contact with each other, wherein the connection terminal penetrates the interposer;
   separating the substrate from the semiconductor circuit at the peeling layer; and
   covering the semiconductor circuit with a resin layer so that the semiconductor circuit is interposed between the interposer and the resin layer and side surfaces of the semiconductor circuit are in contact with the resin layer.

6. The method of manufacturing a semiconductor device according to claim 5, wherein the semiconductor circuit includes an optical sensor for detecting light.

7. The method of manufacturing a semiconductor device according to claim 6, wherein the optical sensor includes a color filter.

8. The method of manufacturing a semiconductor device according to claim 5, further comprising the step of:
   forming the adhesive over the semiconductor circuit before the step of attaching.

9. A method of manufacturing a semiconductor device, comprising the steps of:
   forming a peeling layer over a substrate;
   forming a plurality of semiconductor circuits over the peeling layer, wherein each of the semiconductor circuits includes an electrode terminal;
   attaching the semiconductor circuits and an interposer provided with connection terminals with an anisotropic conductive adhesive interposed therebetween in such a manner that each of the electrode terminals and each of the connection terminals are electrically connected to each other through the anisotropic conductive adhesive, wherein the connection terminals penetrate the interposer;
   separating the substrate from the semiconductor circuits at the peeling layer;
   forming a groove on a periphery of the plurality of semiconductor circuits to expose the interposer;
   covering the semiconductor circuits and filling the groove with a resin layer so that the semiconductor circuits are interposed between the interposer and the resin layer and side surfaces of the semiconductor circuits are in contact with the resin layer; and
   cutting the resin layer and the interposer along the groove with a cut width narrower than the groove.

10. The method of manufacturing a semiconductor device according to claim 9, wherein each of the semiconductor circuits includes an optical sensor for detecting light.

11. The method of manufacturing a semiconductor device according to claim 10, wherein the optical sensor includes a color filter.

12. The method of manufacturing a semiconductor device according to claim 9, further comprising the step of:
   forming the anisotropic conductive adhesive over the semiconductor circuit before the step of attaching.

13. A method of manufacturing a semiconductor device, comprising the steps of:
   forming a peeling layer over a substrate;
   forming a plurality of semiconductor circuits over the peeling layer, wherein each of the semiconductor circuits includes an electrode terminal;
   attaching the semiconductor circuits and an interposer provided with connection terminals with an adhesive interposed therebetween in such a manner that each of the electrode terminals and each of the connection terminals are in contact with each other, wherein the connection terminals penetrate the interposer;

separating the substrate from the semiconductor circuits at the peeling layer;

forming a groove on a periphery of the semiconductor circuits to expose the interposer;

covering the semiconductor circuits and filling the groove with a resin layer so that the semiconductor circuits are interposed between the interposer and the resin layer and side surfaces of the semiconductor circuits are in contact with the resin layer; and cutting the resin layer and the interposer along the groove with a cut width narrower than the groove.

14. The method of manufacturing a semiconductor device according to claim 13, wherein each of the semiconductor circuits includes an optical sensor for detecting light.

15. The method of manufacturing a semiconductor device according to claim 14, wherein the optical sensor includes a color filter.

16. The method of manufacturing a semiconductor device according to claim 13, further comprising the step of:

forming the adhesive over the semiconductor circuit before the step of attaching.

* * * * *